(12) United States Patent
Kroening

(10) Patent No.: US 9,472,837 B1
(45) Date of Patent: Oct. 18, 2016

(54) (M+1)-FOR-M FERRITE REDUNDANCY SWITCH AND SWITCH SYSTEM

(71) Applicant: Honeywell International Inc., Morristown, NJ (US)

(72) Inventor: Adam M. Kroening, Atlanta, GA (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 14/693,599

(22) Filed: Apr. 22, 2015

(51) Int. Cl.
*H01P 1/39* (2006.01)
*H01P 1/383* (2006.01)
*H01P 1/36* (2006.01)

(52) U.S. Cl.
CPC ............... *H01P 1/383* (2013.01); *H01P 1/36* (2013.01); *H01P 1/39* (2013.01)

(58) Field of Classification Search
CPC ............ H01P 1/36; H01P 1/38; H01P 1/383; H01P 1/387; H01P 1/39
USPC .................................................. 333/1.1, 24.2
See application file for complete search history.

(56) References Cited

U.S. PATENT DOCUMENTS

| | | | |
|---|---|---|---|
| 4,061,989 A | 12/1977 | Petrelis | |
| 4,109,202 A | 8/1978 | Kudsia et al. | |
| 4,688,259 A | 8/1987 | Edridge | |
| 5,608,361 A | 3/1997 | Weiss et al. | |
| 6,885,257 B2 | 4/2005 | Kroening | |
| 7,049,900 B2 | 5/2006 | Kroening | |
| 7,176,767 B2 | 2/2007 | Kroening | |
| 7,230,507 B2 | 6/2007 | Kroening | |
| 7,816,995 B1* | 10/2010 | Allen | H01P 1/32 333/1.1 |
| 8,957,741 B2 | 2/2015 | Kroening | |
| 2003/0107447 A1 | 6/2003 | Kroening | |
| 2011/0248796 A1 | 10/2011 | Pozgay | |
| 2014/0320227 A1 | 10/2014 | Kroening et al. | |
| 2016/0013530 A1 | 1/2016 | Kroening | |

OTHER PUBLICATIONS

Kroening, "Systems and Methods for Ferrite Redundancy Switch Networks", "U.S. Appl. No. 14/537,650, filed Nov. 10, 2014",, pp. 1-33, Published in: US.
Burrows, "Technical Report 639: Design of Microwave Beam-Switching Networks", Dec. 5, 1983, pp. 1-83, Publisher: Lincoln Laboratory, Massachusetts Institute of Technology.
EMS Technologies Inc., "Miniaturized Ferrite Switch Networks", "Microwave Journal Frequency Matters", Jul. 1, 2003, pp. 1-4.

(Continued)

*Primary Examiner* — Stephen E Jones
(74) *Attorney, Agent, or Firm* — Fogg & Powers LLC

(57) ABSTRACT

An (M+1)-for-M redundant switch, where M is an integer greater than 1, is provided. The (M+1)-for-M redundant switch includes a first switch-triad-assembly including a first switching element circulator and two element isolators; a second switch-triad-assembly including a second switching element circulator and two element isolators and; and at least one inverted-switch-triad-assembly including a third switching element circulator and two element isolators. One of the element isolators of the first switch-triad-assembly is arranged to couple power with one of the two element isolators of one of the at least one inverted-switch-triad-assembly. One of the element isolators of the second switch-triad-assembly is arranged to couple power with another one of the two element isolators of one of the at least one inverted-switch-triad-assembly.

20 Claims, 10 Drawing Sheets

(56) References Cited

OTHER PUBLICATIONS

Kroening, "Advances in Ferrite Redundancy Switching for Ka-band Low Noise Amplifiers", Mar. 2, 2015, pp. 1-7.

Liang et al., "Integrated Redundancy Ring Based on Modular Approach", "26th International Communications Satellite Systems Conference (ICSSC)", Jun. 10-12, 2008, pp. 1-7, Publisher: American Institute of Aeronautics and Astronautics, Published in: San Diego, CA.

* cited by examiner

(M+1)-FOR-M FERRITE REDUNDANCY SWITCH AND SWITCH SYSTEM

BACKGROUND

In some communication networks, certain communication nodes in the network are not easily accessible for repairs in the event that equipment on the communication node experiences a failure. For example, communication nodes located in space are practically inaccessible and, as such, that failed equipment cannot be repaired. To prevent the failures from affecting the operation of the communication node, the communication equipment on the communication node includes standby equipment that increases the redundancy of any communication paths through the communication equipment. To control which communication paths are used through the communication equipment, a switch system is used to switch a communication path from failed equipment to standby equipment.

Since low noise amplifiers are prone to failures, a communication node typically includes at least one spare amplifier depending on the size of the system. A switch system can be implemented using a network of switching ferrite circulators. Upon experiencing a failure of a low noise amplifier, the system switches a communication path from an input through the switch system without affecting other communication paths through the switch system.

For the reasons stated above and for other reasons stated below which will become apparent to those skilled in the art upon reading and understanding the specification, there is a need in the art for improved systems and methods for switch system is used to switch a communication path from failed equipment to standby equipment.

SUMMARY

The embodiments of the present invention provide methods and systems for a modular ferrite switch for constructing switch systems and will be understood by reading and studying the following specification.

The present application relates to an (M+1)-for-M redundant switch, where M is an integer greater than 1. The (M+1)-for-M redundant switch includes a first switch-triad-assembly, a second switch-triad-assembly, and at least one inverted-switch-triad-assembly. The first switch-triad-assembly includes a first switching element circulator and two element isolators. The second switch-triad-assembly includes a second switching element circulator and two element isolators. The at least one inverted-switch-triad-assembly includes a third switching element circulator and two element isolators. One of the element isolators of the first switch-triad-assembly is arranged to couple power with one of the two element isolators of one of the at least one inverted-switch-triad-assembly. One of the element isolators of the second switch-triad-assembly is arranged to couple power with another one of the two element isolators of one of the at least one inverted-switch-triad-assembly.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize features relevant to the present invention. Reference characters denote like elements throughout figures and text.

DETAILED DESCRIPTION

Figure 1:
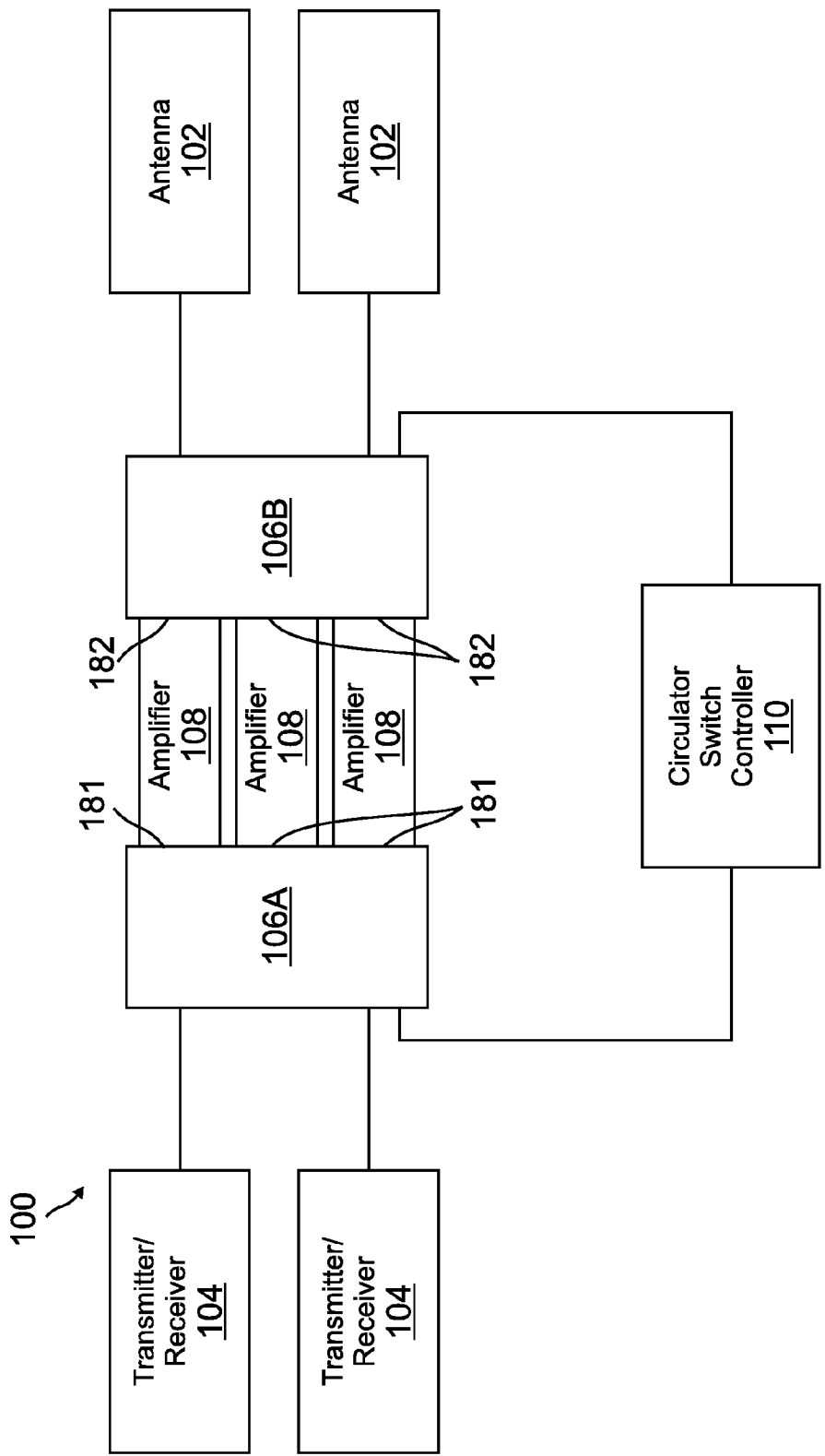
FIG. 1 is a block diagram of an embodiment of an (M+1)-for-M redundant switch node that includes two (M+1)-for-M redundant switches in accordance with the present application.

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

The embodiments of switches described herein provide ferrite switch configurations for (M+1)-to-(M) that utilize reduced size switches. The terms "ferrite material" and "ferrimagnetic material" are used interchangeably herein. The ferrite elements (also referred to herein as "elements") described herein are made from ferrite, garnet, or other ferrimagnetic materials. For small satellites, the tradeoff of high reliability versus small size, mass, and cost is tipped heavily to size/mass/cost reductions. Redundancy may not even be required in small satellites, but if required, it will be required at a low rate of spares, such as 3-for-2, 4-for-3, or 5-for-4. The embodiments of switches described herein provide (M+1)-for-M switching with improved performance and reduced size over the currently available (M+1)-for-M switch configurations.

The input/output ports and isolator loads of the currently available (M+1)-for-M switches are too close to one another to be implemented entirely with the reduced-size switches described herein, embodiments of which have a de minimus gap between adjacent legs of at least two ferrite elements that form the switch. Therefore, currently available (M+1)-for-M switches have a size, mass, and insertion loss that is greater than the size, mass and insertion loss of the of the (M+1)-for-M redundant switches described herein.

Various implementations of switching nodes, which provide redundancy to allow for a failure in a communication path through a switching node, are described herein. Further, the implementations described herein further provide switching nodes where the communication path of a channel can change without affecting the communication paths of other channels when the switching network experiences a failure, such as an amplifier failure. The switch nodes are bidirectional. The ports of the waveguides described herein are functional as both input ports and output ports depending on the direction of propagation of the electro-magnetic fields. Thus, the (M+1)-for-M redundant switches have (M+1) input ports and M output ports for one direction of propagation of the electro-magnetic fields, and have (M+1) output ports and M input ports for the opposite direction of propagation of the electro-magnetic fields. The ports of the waveguides are also referred to here as "input/output ports", "I/O ports", and "waveguide ports". The legs of the circulator elements, which are positioned in the waveguides that terminate with open-ended I/O ports, are referred to herein as "port legs" or "I/O port legs".

FIG. 1 is a block diagram of an embodiment of a switch node 100 that includes two (M+1)-for-M redundant switches 106 in accordance with the present application. The switch node 100 is useful for smaller satellites. The switch node 100 includes two (M+1)-for-M redundant switches 106 and a plurality of (M+1) components 108. M is an integer greater than 1 and, for the exemplary case shown in FIG. 1, M=2. Thus, for the exemplary case shown in FIG. 1, the two (M+1)-for-M redundant switches 106 are 3-for-2 redundant switches 106 coupled to three components 108. The two (M+1)-for-M redundant switches 106 include a first (M+1)-for-M redundant switch 106A and a second (M+1)-for-M redundant switch 106B. The first (M+1)-for-M redundant switch 106A and the second (M+1)-for-M redundant switch 106B are referred to herein as a pair of (M+1)-for-M redundant switches 106A and 106B. For each pair of (M+1)-for-M redundant switches 106A and 106B, there are a respective (M+1) components 108.

The switch node 100 is also referred to herein as an "(M+1)-for-M redundant ferrite switch node 100", an "(M+1)-for-M redundant switch node 100", and an "(M+1)-for-M ferrite redundancy switch node 100". The "(M+1)-for-M redundant switch 106" is also referred to herein as an "(M+1)-for-M redundant ferrite switches 106" and an "(M+1)-for-M ferrite redundancy switches 106".

The components 108 have a first input/output port 181 and a second input/output port 182. The first (M+1)-for-M redundant switch 106A is coupled to the first input/output ports 181 of the components 108. The second (M+1)-for-M redundant switch 106B is coupled to the second input/output ports 182 of the components 108.

As shown in FIG. 1, the components 108 are amplifiers 108, but other types of components can be used in the switch nodes 100. The two (M+1)-for-M redundant switches 106 are able to route a path through the (M+1)-for-M redundant ferrite switch node 100 when one component 108 in the (M+1) components 108 has failed.

The exemplary switch node 100 shown in FIG. 1 is part of a communication network that transmits and receives signals. For example, the switch node 100 receives a signal through at least one antenna 102. The signal is amplified by at least one amplifier 108 and is then processed by at least one transmitter/receiver 104. Typically, each operational amplifier is communicatively coupled between a respective transmitter/receiver 104 and antenna 102. In at least one implementation, the amplifier 108 may be a low noise amplifier (LNA), a power amplifier, a travelling wave tube amplifier (TWTA), or the like. Also, in certain implementations, the transmitter/receiver 104 provides a signal that is amplified by the amplifiers 108 and then provided to the antenna 102 for radiation to another communication node in the communication network. In certain embodiments, the switch node 100 is implemented on a platform that is inaccessible for repairs when a component on the system experiences a fault. For example, the switch node 100 may be implemented on a satellite located in space or other inaccessible location. In certain embodiments, the switch node 100 is implemented on a platform that is accessible, but is remote and difficult to access (for example, located in Antarctica) for repairs when a component on the system experiences a fault.

An amplifier 108 in the switch node 100 may experience a failure during the life of the switch node 100. To prevent the failure from negatively affecting the operation of the switch node 100, when the switch node 100 begins operation, the switch node 100 includes one standby amplifier 108 to be used in the event that an operating amplifier fails. When an operating amplifier fails, a circulator switch controller 110 changes a communication path that diverts away from the failed amplifier 108 to pass through the standby amplifier 108. Specifically, the non-operational amplifier becomes operational upon being communicatively coupled to the transmitter/receiver 104 and antenna 102, while the failed amplifier 108 becomes non-operational. In this manner, the switch node 100 remains operational when an amplifier 108 fails.

As shown in FIG. 1, the amplifiers 108 are used as examples of electronic components, where the input/output ports 181/182 of the components 108 may connect to other components through transmission media that includes waveguides, microstrip, coaxial, and the like. In at least one implementation, the components 108 may connect to other components via adapters that allow the component to interface with other components fabricated in a different transmission media. It is intended that the switching node 100, as described herein, can be used to change the RF path through an operating component to a standby component.

In at least one embodiment, an (M+1)-for-M redundant switch 106 contains multiple ferrite circulators that are connected to one another to provide switching capabilities between input/output legs. In certain implementations, the circulators in an (M+1)-for-M redundant switch 106 may be waveguide circulators, where each circulator has three legs arranged at 120° that meet in a common junction. The common junction may be loaded with a non-reciprocal material such as ferrite. In this latter embodiment, the (M+1)-for-M redundant switches 106 are (M+1)-for-M redundant ferrite switches 106. The (M+1)-for-M redundant switches 106 that contain multiple ferrite circulators are able to be arranged with a reduced size as described below.

When a magnetizing field is created in the ferrite element that is located at the common junction, a gyromagnetic effect can be used to switch the microwave signal from one leg of the ferrite element to another leg of the ferrite element. By reversing the direction of the magnetizing field, the direction of switching between the legs of the ferrite element is reversed. Thus, a switching circulator is functionally equivalent to a fixed-bias circulator but has a selectable direction of circulation. Radio frequency (RF) energy (electromagnetic fields) can be routed with low insertion loss from one leg of the ferrite element in one waveguide arm of a waveguide structure to either of the two other legs of the ferrite element. If one of the legs of the ferrite element is terminated in a matched load, then the circulator acts as an isolator, with high loss in one direction of propagation and low loss in the other direction. Reversing the direction of the magnetizing field will reverse the direction of high and low isolation.

In certain embodiments, to control the direction of magnetization for the ferrite circulators in the (M+1)-for-M redundant switch 106, the switch node 100 includes a circulator switch controller 110. The circulator switch controller 110 sends electrical signals to the individual circulator elements that control the direction of circulation for each circulator. For example, the circulator switch controller 110 sends a high current pulse to a particular circulator that changes the direction of circulation in that circulator. In certain implementations, the circulator switch controller 110 includes a separate driver that is associated with each circulator in the switch node 100, where the driver provides a switching signal to an individual circulator. In at least one other implementation, where switching time is not critical, the circulator switch controller 110 may include a single driver that is multiplexed to the separate circulators in the (M+1)-for-M redundant switch 106. In a further embodiment, the circulator switch controller 110 includes an interface that allows a user to control the switching directly through another device.

The circulator switch controller 110 can include a processor to implement software to determine how to control the (M+1)-for-M redundant switch 106. The methods for switching the (M+1)-for-M redundant switches described here may be implemented in analog electronic circuitry, digital electronic circuitry, or with a programmable processor, firmware, software, or in combinations of them. Apparatus embodying these techniques may include appropriate input and output devices, a programmable processor, and a storage medium tangibly embodying program instructions for execution by the programmable processor. Storage devices suitable for tangibly embodying program instructions and data include all forms of non-volatile memory, including by way of example semiconductor memory devices, such as EPROM, EEPROM, and flash memory devices; magnetic disks such as internal hard disks and removable disks; magneto-optical disks; and DVD disks. Any of the foregoing may be supplemented by, or incorporated in, specially-designed ASICs, or mixed-signal ASICs which contain analog and digital circuitry.

The (M+1)-for-M redundant switches 106 include multiple ferrite elements that typically have impedance-matching transitions between each ferrite element. For example, a conventional waveguide circulator may transition from one ferrite element to a dielectric-filled waveguide such as a quarter-wave dielectric transformer structure, to an air-filled waveguide, and then back to another dielectric-filled waveguide section and the next ferrite element. The conventional dielectric transformers are typically used to match the lower impedance of the ferrite element to that of an air-filled waveguide.

As stated above, an (M+1)-for-M redundant switch 106 may contain multiple waveguide circulators. Further, the (M+1)-for-M redundant switch 106 may also include multiple load elements for isolation of certain ports in some of the ferrite circulators. The circulators and load elements can be connected in various configurations according to the modular design of the (M+1)-for-M redundant switch 106 described herein. Isolators are added to the switch so that the impedance match for any one port is independent of the impedance match on the other ports and so that the RF energy input to one port does not interfere with the RF signals input to the other ports. If one of the legs of the waveguide circulators is terminated in a matched load, then the circulator acts as an isolator, with high loss in one direction of propagation and low loss in the other direction. Matched loads are used on any unneeded ports and unconnected interconnection ports. The element isolators are referred to herein as "non-switching ferrite element isolators" and "ferrite element isolators". In one implementation of this embodiment, the element isolator is a ferrite element isolator. In another implementation of this embodiment, the switching element circulator is a switching ferrite element circulator made from ferrite. The terms "switching element circulator", "switching ferrite element circulator", "ferrite circulators", "waveguide circulators" and "switching ferrite element" are used interchangeably herein.

In one implementation of this embodiment, there are two or more pairs of (M+1)-for-M redundant switches 106A and 106B and a respective more than two sets of (M+1) components 108. For example, if the single (M+1)-for-M redundant switch 106A at the input/output ports 181 of the components 108 is replaced by three (M+1)-for-M redundant switches 106A at the input/output ports 181 of three sets of components 108, then the single (M+1)-for-M redundant switch 106B at the input/output ports 182 of the components 108 is replaced by three (M+1)-for-M redundant switches 106B at the input/output port 182 of three sets of components 108. In one implementation of this embodiment, a plurality of pairs of (M+1)-for-M redundant switches 106A and 106B are each functional with a respective plurality of antennas 102. In an embodiment in which the node includes a plurality of pairs of (M+1)-for-M redundant switches 106A/106B, there is a respective plurality of (M+1) components for each pair of (M+1)-for-M redundant switches 106A/106B. The first input/output ports 181 of the (M+1) components 108 are coupled to a first one of the respective pair of (M+1)-for-M redundant switches 106A/106B and second input/output ports 182 of the (M+1) components 108 are coupled to a second one of the respective pairs of (M+1)-for-M redundant switches 106A/106B. Thus, there is no coupling between the (M+1)-for-M redundant switches 106A on the first input/output port side. Likewise, there is no coupling between the (M+1)-for-M redundant switches 106B on the second input/output port side.

Figure 2A:
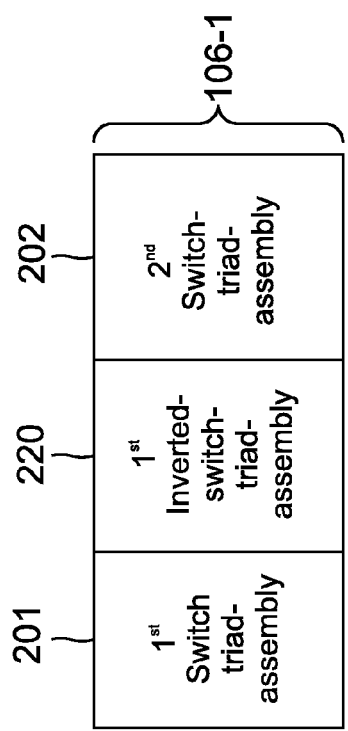
FIGS. 2A and 2B are a block diagrams of embodiments of (M+1)-for-M redundant switches in the switch node of FIG. 1 in accordance with the present application.
Figure 2B:
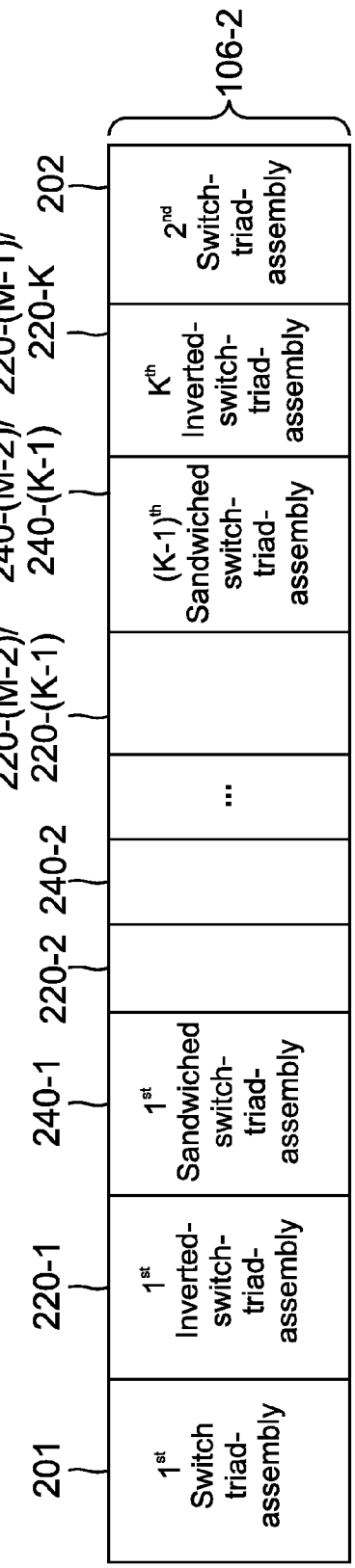

FIGS. 2A and 2B are block diagrams of embodiments of (M+1)-for-M redundant switches 106 in the switch node 100 of FIG. 1 in accordance with the present application. The (M+1)-for-M redundant switches 106 includes a plurality of switch-triad-assemblies arranged in a simple, linear, alternating pattern. A switch-triad-assembly includes three elements that are configured in a manner so that one leg of each element is adjacent to one leg of a neighboring element. In one implementation of this embodiment, the elements are ferrite elements. Triad switches are described in greater detail in U.S. Pat. No. 6,885,257 titled "Multi-Junction Waveguide Circulator without Internal Transitions", which is herein incorporated by reference.

As shown in FIG. 2A, the (M+1)-for-M redundant switch 106-1 includes: a first switch-triad-assembly 201; a second switch-triad-assembly 202; and one inverted-switch-triad-assembly 220. This is a 3-for-2 arrangement. Two 3-for-2 redundant switches 106-1 are coupled to three components 108 in a 3-for-2 redundant switch node 100 of FIG. 1. An inverted-switch-triad-assembly includes a switching element circulator and two element isolators. Details about the 3-for-2 redundant switches 106-1 are described below with reference to FIGS. 3 and 4.

As shown in FIG. 2B, the (M+1)-for-M redundant switch 106-2 includes: a first switch-triad-assembly 201; a second switch-triad-assembly 202; and a plurality of inverted-switch-triad-assemblies 220-1, 220-2, . . . , 220-K, wherein K is an integer greater than one; and a plurality of sandwiched-switch-triad-assemblies 240-1, 240-2, . . . , 240-(K−1). It is to be noted that in this case in which M≥3, K=M−1 and thus (K−1)=(M−2). Thus, 240-(K−1) is also 240-(M−2). A sandwiched switch-triad-assembly includes a switching element circulator and two element isolators, which are alternately interposed between inverted-switch-triad-assemblies 240 in an arrangement in which the element isolators of (K−1) sandwiched switch-triad-assemblies are arranged to couple power with the element isolators of K inverted-switch-triad-assemblies 220.

In one implementation of this embodiment, the (M+1)-for-M redundant switch 106-2 is a 4-for-3 redundant switch 106-2. In that case, the redundant switch 106-2 includes: the first switch-triad-assembly 201; the second switch-triad-assembly 202; two inverted-switch-triad-assemblies 220-1 and 220-2, and one sandwiched-switch-triad-assembly 240-1. Two 4-for-3 redundant switches 106-2 are coupled to four components 108 in a 4-for-3 redundant switch node 100 of FIG. 1.

In another implementation of this embodiment, the (M+1)-for-M redundant switch 106-2 is a 5-for-4 redundant switch 106-2. In that case, the redundant switch 106-2 includes: the first switch-triad-assembly 201; the second switch-triad-assembly 202; three inverted-switch-triad-assemblies 220-1, 220-2, 220-3; and two sandwiched-switch-triad-assemblies 240-1 and 240-2. Two 5-for-4 redundant switches 106-2 are coupled to five components 108 in a 5-for-4 redundant switch node 100 of FIG. 1. Additional inverted-switch-triad-assemblies and sandwiched-switch-triad-assemblies can be added if more components 108 are required an (M+1)-for-M redundancy as is understandable to one skilled in the art upon reading and understanding this application.

The embodiment of a 3-for-2 redundant switch 106-1 and the configuration of elements in the first switch-triad-assembly 201; the second switch-triad-assembly 202; and the inverted-switch-triad-assembly 220 are described with reference to FIGS. 3 and 4. An embodiment of a 5-for-4 redundant switch 106-2 and the configuration of elements in the first switch-triad-assembly 201; the second switch-triad-assembly 202; and the inverted-switch-triad-assemblies 220 (1-K); and the inverted-switch-triad-assemblies 240(1-(K−1)) are described below in detail with reference to FIGS. 6 and 7.

Figure 3:
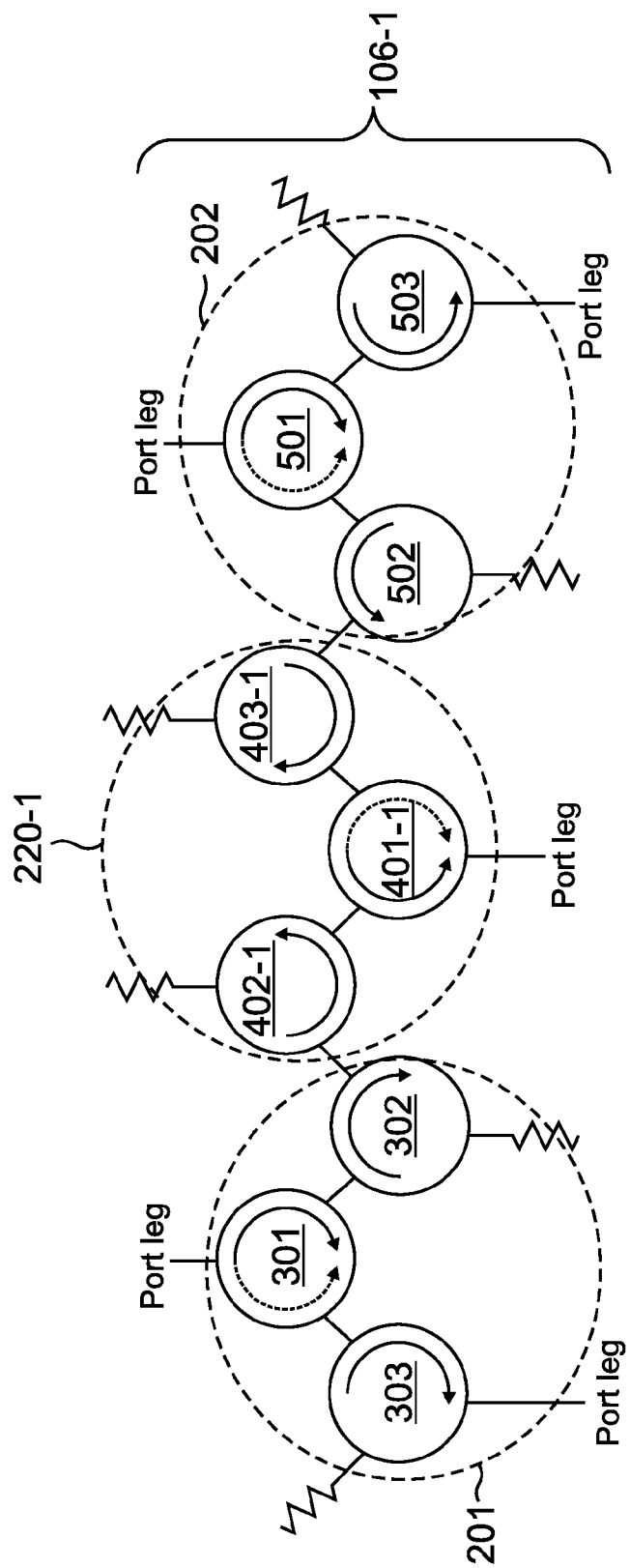
FIG. 3 is a schematic illustration of an embodiment of an (M+1)-for-M redundant switch configuration in accordance with the present application.

FIG. 3 is a schematic illustration of an embodiment of an (M+1)-for-M redundant switch configuration in accordance with the present application. In the configuration shown in FIG. 3, M equals two. FIG. 4 is a top view of a switch system including an (M+1)-for-M redundant switch configured as shown in FIG. 3 and positioned in a waveguide structure 800 in accordance with the present application. In one implementation of this embodiment, the switch-triad-assemblies 201, 202, and 220-1 include ferrite elements. The following figures are described with reference to "ferrite elements".

As shown in FIG. 3, the 3-for-2 redundant switch 106-1 includes a first switch-triad-assembly 201, a second switch-triad-assembly 202, and an inverted-switch-triad-assembly 220-1. The first switch-triad-assembly 201 includes a first switching ferrite element circulator 301 and two ferrite element isolators 302 and 303. The second switch-triad-assembly 202 includes a second switching ferrite element circulator 501 and two ferrite element isolators 502 and 503. The inverted-switch-triad-assembly 220-1 includes a third switching ferrite element circulator 401-1 and two ferrite element isolators 402-1 and 403-1. The ferrite element isolator 302 is arranged to couple power with the ferrite element isolator 402-1. The ferrite element isolator 502 is arranged to couple power with the ferrite element isolator 403-1.

In one implementation of this embodiment, the ferrite element isolators 302 and 303 are switching ferrite element circulators controlled to circulate electromagnetic fields in one direction. In another implementation of this embodiment, the ferrite element isolators 302, 303, 502, and 503 are switching ferrite element circulators 302, 303, 502, and 503. As defined herein a switching ferrite element circulator is controlled to circulate electromagnetic fields in one direction until a failure requires at least one switching ferrite element circulator to circulate electromagnetic fields in an opposite direction. Thus, the switching ferrite element circulators 302, 303, 502, and 503 are in a state and are only switched when a failure requires a switch after which the switching ferrite element circulators 302, 303, 502, and 503 are held in that state until another failure requires a reconfiguration.

Figure 4:
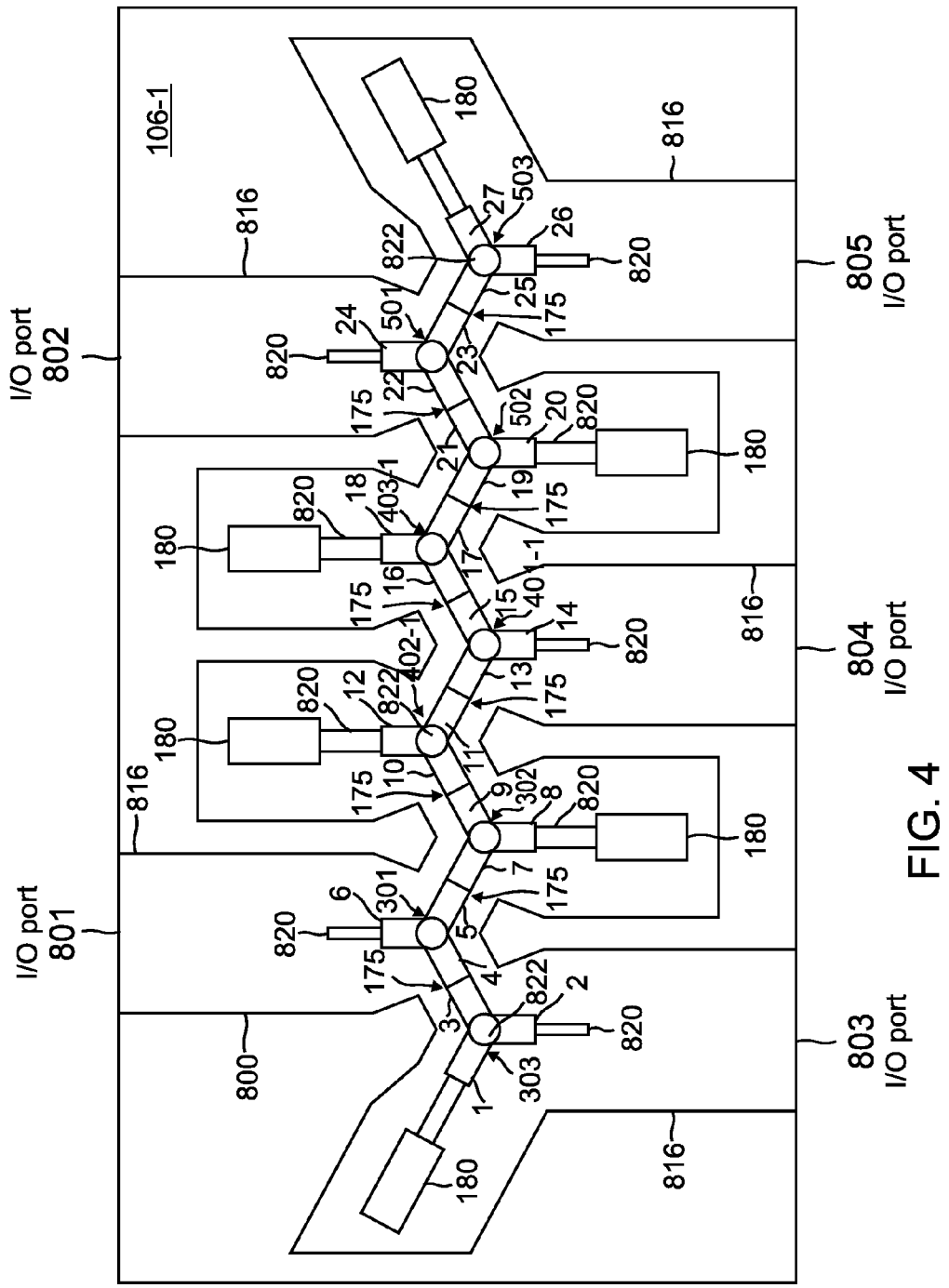
FIG. 4 is a top view of a switch system including an (M+1)-for-M redundant switch configured as shown in FIG. 3 and positioned in a waveguide structure in accordance with the present application.

As shown in FIG. 4, the (M+1)-for-M redundant switch 106-1 is positioned within a waveguide structure 800 that includes input/output (I/O) ports 801-805. The ferrite elements are arranged to couple electromagnetic fields that propagate (typically as radio frequency waves) between adjacent legs of the elements 301-303, 501-503, 401-1, 402-1, and 403-1. The waveguide structure 800, which encloses the elements, guides the electromagnetic fields propagating through the elements. The waveguide structure 800 is formed from conductive material. The first switching ferrite element circulator 301 includes a port leg 6 in a first input/output port 801. The ferrite element isolator 303 includes a port leg 2 in a third input/output port 803. The second switching ferrite element circulator 501 includes a port leg 24 in a second input/output port 802. The ferrite element isolator 503 includes a port leg 26 in a fifth input/output port 805. The switching ferrite element circulator 401-1 includes a port leg 14 in a respective a fourth input/output port 804. The leg 9 of ferrite element isolator 302 of the first switch-triad-assembly 201 is arranged to couple power with leg 10 of the ferrite element isolator 402-1 of the inverted-switch-triad-assembly 220-1 The leg 19 of the ferrite element isolator 502 of the second switch-triad-assembly 202 is arranged to couple power with leg 17 of the ferrite element isolator 403-1 of the inverted-switch-triad-assembly 220-1.

In one implementation of this embodiment, the 3-for-2 redundant switch 106-1 shown in FIG. 4 is implemented in the node 100 of FIG. 1. In this case, there are three components 108 for a respective pair of 3-for-2 redundant switches, wherein first input/output ports 181 of the three components are coupled to a first one of the two 3-for-2 redundant switches 106A or 106B (FIG. 1) and second input/output ports 182 of the three components are coupled to a second one of the two 3-for-2 redundant switches 106B or 106A. In this case, first switch-triad-assembly 201, the second switch-triad-assembly 202, and the inverted-switch-triad-assembly 220-1 are able to route a path through the (M+1)-for-M redundant ferrite switch node 100 when a component 108 in the three components 108 has failed.

As shown in FIG. 4, the legs of the ferrite elements that are not coupled to a leg of an adjacent ferrite element or an input/output port of the waveguide structure are loaded with an impedance matched load 180.

In certain implementations, a quarter wave dielectric transformer 820 is attached to the ends of a ferrite element (e.g., ferrite element isolator 303, first switching ferrite element circulator 301, third switching ferrite element circulator 401-1, second switching ferrite element circulator 501, and ferrite element isolator 503) that are farthest away from the middle of the respective ferrite elements. The quarter wave dielectric transformers 820 aid in the transition of the RF energy (electromagnetic fields) from a ferrite element to an air-filled waveguide arm represented generally at 816. Dielectric transformers 820 are typically used to match the lower impedance of the ferrite elements 301, 303, 401-1, 501, and 503 to that of the air-filled waveguide arms 816. In alternative implementations, ferrite elements (e.g., ferrite element isolator 303, first switching ferrite element circulator 301, third switching ferrite element circulator 401-1, second switching ferrite element circulator 501, and ferrite element isolator 503) transition to the air-filled waveguide arm 816 without an aiding dielectric transformer 820. To transition directly, without an aiding transformer, from the ferrite element to an air-filled waveguide arm 816, the legs of the ferrite elements 301, 303, 401-1, 501, and 503 may be designed so that the impedance of the ferrite elements 301, 303, 401-1, 501, and 503 matches the impedance of the air-filled waveguide arm 816. For example, the legs of the ferrite elements 301, 303, 401-1, 501, and 503 are designed to be narrower than corresponding switching elements that are designed to interface with dielectric transformers 820. Further, the material that is used to fabricate the ferrite elements 301, 303, 401-1, 501, and 503 is selected to have a particular saturation magnetization value, such that the impedance of the ferrite elements 301, 303, 401-1, 501, and 503 matches the impedance of the air filled waveguide arm 816.

In further embodiments, a top dielectric spacer 822 is disposed on the top surface of ferrite element that is parallel to the H-plane. Spacer 822 is used to position ferrite elements 301-303, 401-1, 402-1, 403-1, and 501-503 in the waveguide housing and to provide a thermal path out of ferrite elements 301-303, 401-1, 402-1, 403-1, and 501-503 for high power applications. Generally, two dielectric spacers 822 can be used. The two dielectric spacers 822 are located on opposite sides of the ferrite elements 301-303, 401-1, 402-1, 403-1, and 501-503. All of the components described above are disposed within the waveguide structure 800. The field guiding regions of the waveguide structure 800 (e.g., the waveguide arms 816) are generally air-filled other than the ferrite element, transformers, spacers, winding, and the like. The waveguide input/output arms 816 provide interfaces for signal input and output. The waveguide input/output arms 816 end in opening that are referred to herein as waveguide input/output ports 801-805.

No quarter-wave transformers are needed between the switch junctions. Gaps having de minimus length of unloaded waveguide are between the end faces of the elements that form the switch-triad-assemblies. In this manner, the 3-for-2 redundant switch 106-1 has a smaller assembly size than the conventional 3-for-2 redundant switches.

Figure 5:
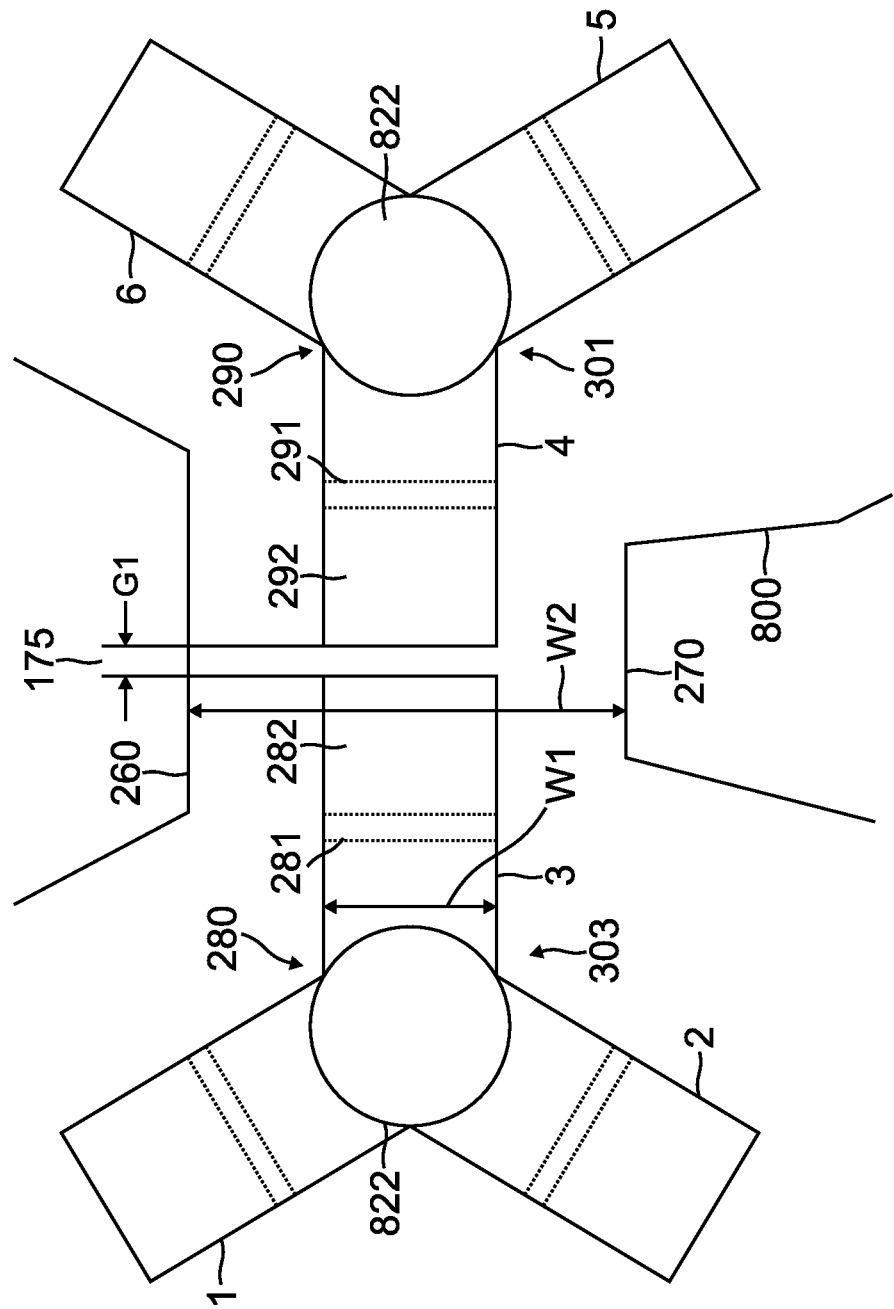
FIG. 5 shows a magnified view of a portion of the (M+1)-for-M redundant switch of FIG. 3 in the waveguide structure of FIG. 4.

FIG. 5 shows a magnified view of a portion of the (M+1)-for-M redundant switch of FIG. 3 in the waveguide structure 800 of FIG. 4. The interface between leg 3 of the ferrite element isolator 303 (element 303) and leg 4 of the first switching ferrite element circulator 301(element 301) is shown in greater detail. The configuration of interface between the legs 3 and 4 is exemplary of the interfaces between the adjacent legs in the (M+1)-for-M redundant switch 106-1 as shown in FIG. 4. For example, in one implementation of this embodiment, the interface between the legs 9 and 10 is the same as the interface between the legs 3 and 4 shown in FIG. 5.

The element 303 is shown with a resonant section 280, a quarter-wave section 282, and dashed lines 281 representing an aperture bored through the element 303 for the magnetizing winding. Ferrite element 301 is shown with a resonant section 290, a quarter-wave ferrite section 292, and dashed lines 291 representing an aperture bored through the ferrite element 301 for the magnetizing winding. A dielectric spacer 822 overlays a portion of the resonant sections 280 and 290. The implementation of magnetizing windings is described in greater detail in the U.S. Pat. No. 6,885,257 titled "Multi-Junction Waveguide Circulator without Internal Transitions", which is herein incorporated by reference. The impedance matching approach shown in FIG. 5 requires only the use of the two quarter-wave ferrite sections 282 and 292 and a de minimus length G1 of unloaded waveguide between the faces of the ferrite elements 303 and 301. The length G1 is a very small fraction of a wavelength; no greater than a tenth of a waveguide wavelength and on the order of a few thousandths of an inch in the exemplary design for the 27 to 31 GHz frequency range. In contrast, for conventional designs having a frequency range of 27 to 31 GHz, the separation between the faces of the ferrite elements is on the order of 0.5 inches or approximately one hundred times the separation between the faces of length G1 employed in this invention. The length G1 is kept short enough so that the standing waves generated by the impedance mismatches at the ferrite-to-air interfaces effectively cancel each other out. The impedance mismatches at the interfaces between the ferrite resonators 280 and 290 and the ferrite quarter-wave transformer sections 282 and 292, respectively, are separated by a total of a half-wavelength of ferrite-loaded waveguide, so the standing waves generated by these impedance mismatches cancel out as well. Thus, a more compact matching network has been implemented for the microwave signal transition from one ferrite element 303 to a second ferrite element 301.

As stated above, the adjacent legs are located in close proximity to one another so that there is a de minimus air gap 175 of length G1 between them. The "de minimus air gap" is also referred to herein as a "gap". In this embodiment, the gap 175 serves two purposes. The ferrite elements 303 and 301 are both bonded to the conductive waveguide structure 800 through spacers 822. If the (M+1)-for-M redundant switch 106-1 is used in a high power application or in an application that sees a wide range of temperatures, differences in the coefficients of thermal expansion between the ferrite elements 303 and 301, the dielectric spacers 822, and the conductive waveguide structure 800 will stress the adhesive bond lines. Simply stated, the longer the ferrite elements, the higher the stress in the bond lines, and the greater the chances of breaking a bond line or damaging a ferrite element. This de minimus gap 175 between the ferrite elements minimizes the bond-line stress. A second advantage of this de minimus gap 175 is to magnetically isolate the ferrite elements 303 and 301. In this manner, when ferrite element 303 is biased in the desired direction, there will be no crosstalk to affect the magnetic bias fields that are present in the adjacent ferrite element 301, and vise-versa.

By eliminating the conventional quarter-wave dielectric ferrite-to-air transformers and air-filled waveguide section in the transition between two ferrite elements 303 and 301, the resulting matching circuit is essentially a half-wavelength section of ferrite-loaded waveguide. Care must be taken to design this ferrite-loaded waveguide section so that higher order modes cannot propagate and degrade the performance. In FIG. 5, the distance W1 denotes the width of each leg of the ferrite elements 303 and 301. FIG. 5 also shows walls 260 and 270 of the waveguide structure 800 that are adjacent to the ferrite elements. Thus, in FIG. 5, a wall 260 and a wall 270 are disposed in close proximity to the ferrite elements 303 and 301. FIG. 5 also shows a distance W2 that is the distance between opposing walls 260 and 270. The distance W2 must be kept short enough so as to prevent higher order modes from propagating, but also long enough so that the resonant design is not perturbed and so that the half-wavelength section of ferrite-loaded waveguide is still effective in canceling out the standing waves generated by the impedance mismatches at the resonant section-to-quarter-wave ferrite section interfaces.

For the design shown in FIG. 5, the optimal distance W2 was determined empirically, using finite element analysis software. In this design, for the Ka-band of frequency operation, the preferred relationship between distances W1 and W2 is described as follows: W2 is no greater than 4×W1 and W2 is no less than 2×W1. However, it is understood that this dimensional relationship can be varied within the scope of the design of this invention, as required for optimum signal transfer with reduced loss and signal reflection.

In another implementation of this embodiment, there are no gaps between adjacent legs. For example, the ferrite elements can be manufactured from a single piece of ferrite, which results in no gap between the ferrite elements. Ferrite circulators where the junction between two adjacent ferrite elements is a continuous junction having no gap between the adjacent ferrite element legs are described in greater detail in U.S. Pat. No. 7,176,767 titled "Multi-Junction Waveguide Circulator with Elements Having No Discontinuities", which is herein incorporated by reference.

In this exemplary case, a continuous junction having no gap is provided between the leg 9 of the element isolator 302 of the first switch-triad-assembly 201 and the leg 10 of the element isolator 402-1. Likewise, a continuous junction having no gap is provided between the leg 19 of the element isolator 502 of the second switch-triad-assembly 202 and the leg 17 of the element isolator 403-1. For at least one of: the first switch-triad-assembly 201; the second switch-triad-assembly 202; and the at least one inverted-switch-triad-assembly 220-1, a continuous junction having no gap is provided between a leg of the two element isolators and a leg of the switching element circulator. In this case, the gaps 175 shown in FIG. 4 are removed from FIG. 4.

As shown in FIG. 4, the use of the reduced size switches with the gap results in size savings of ⅓ over standard switches, so 9 of these interfacing junctions (i.e., interfaces with gaps 175) are the equivalent size of 3 standard switch junctions, which is half the size of a standard 6 switch junction approach of a typical prior art switch system with air interfaces. The added switch junctions also naturally space out the input/output ports to allow for reasonable-sized flanges for the customer interfaces and keep the input ports (e.g., I/O ports 801 and 802) on opposite faces of the output ports (e.g., I/O ports 803-805) of the (M+1)-for-M redundant switch 106-1. This separation between input and output ports is generally desired by a user for ease of system design.

As described above with reference to FIG. 2B, embodiments of the (M+1)-for-M redundant switches described herein include a first switch-triad-assembly 201, a second switch-triad-assembly 202, a plurality of K inverted-switch-triad-assemblies 220(1-K), and plurality of (K−1) sandwiched switch-triad-assemblies 240(1-(K−1)), which are alternately interposed between the K inverted-switch-triad-assemblies 220(1-K) or 220-1, 220-2, and 220-3. The (K−1) sandwiched switch-triad-assemblies 240(1-(K−1)) include a switching ferrite element circulator 601-$i$ and two ferrite element isolators 602-$i$ and 603-$i$, where i is a positive integer.

Figure 6:
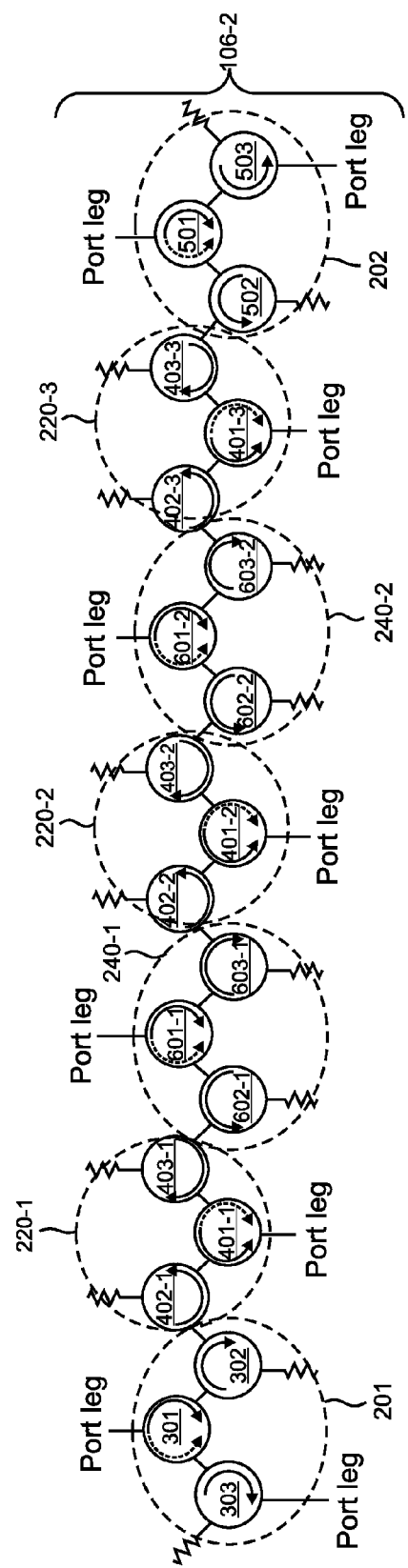
FIG. 6 is a schematic illustration of an embodiment of an (M+1)-for-M redundant switch configuration in accordance with the present application.
Figure 7:
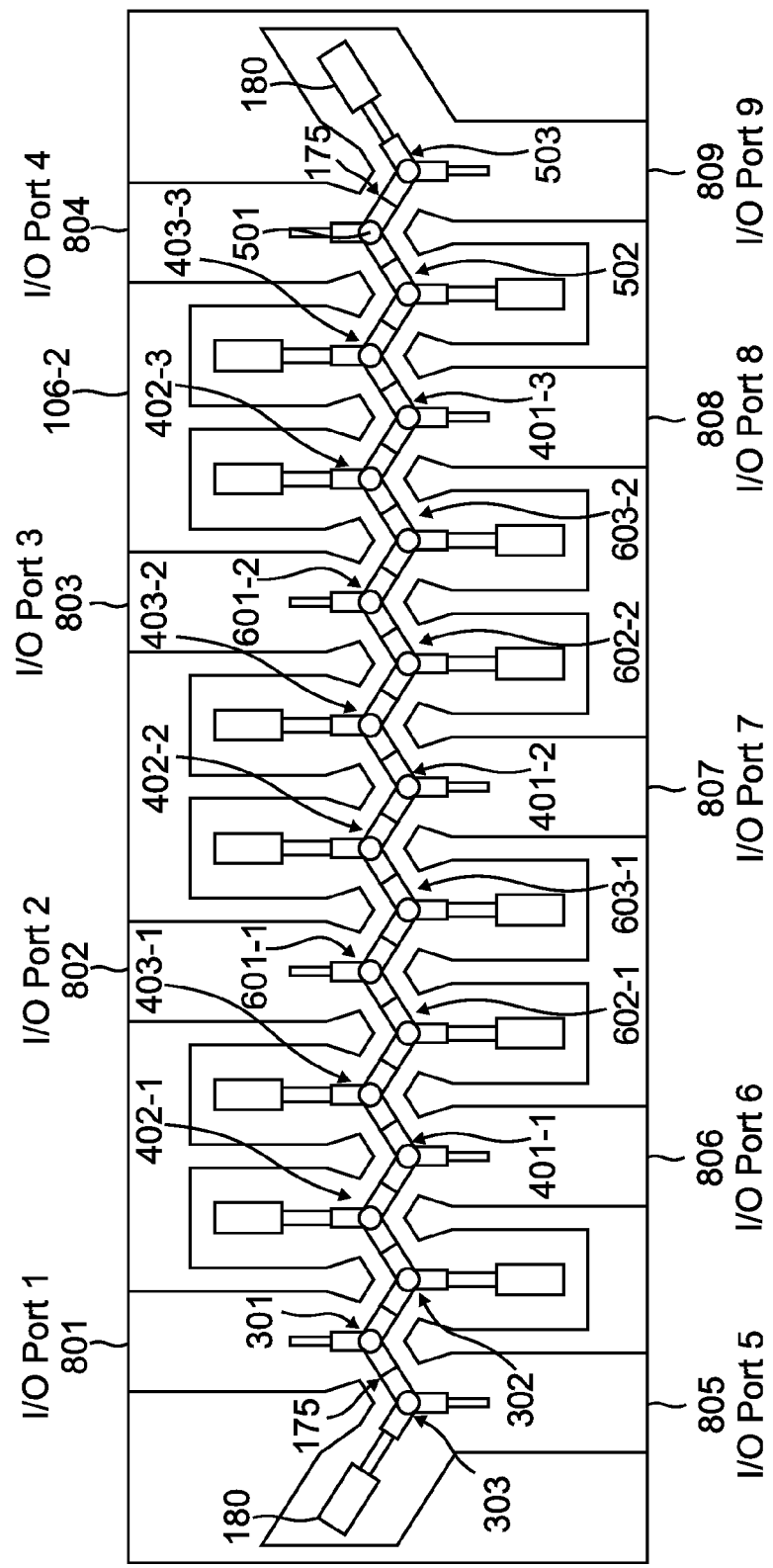
FIG. 7 is a top view of a switch system including an (M+1)-for-M redundant switch configured as shown in FIG. 6 and positioned in a waveguide structure in accordance with the present application.

FIG. 6 is a schematic illustration of an embodiment of an (M+1)-for-M redundant switch configuration in accordance with the present application. In the configuration shown in FIG. 6, M equals four. Thus, the 3-for-2 pattern of FIGS. 3 and 4 is extended linearly for a 5-for-4 redundant switch 106-2 shown in FIG. 6 by the addition of two sandwiched switch-triad-assemblies 240-1 and 240-2 and two more inverted-switch-triad-assemblies 220-2 and 220-3. FIG. 7 is a top view of a switch system including an (M+1)-for-M redundant switch 106-2 configured as shown in FIG. 6 and positioned in a waveguide structure 800 in accordance with the present application.

The ferrite element isolators 602-$i$ and 603-$i$ of the (K−1) sandwiched switch-triad-assemblies 240-1 and 240-2 are arranged to couple power with the ferrite element isolators 403-$f$ and 402-$g$ of the K inverted-switch-triad-assemblies 220-1, 220-2, and 220-3, where f and g are is positive integers. The 5-for-4 redundant switch 106-2 is designed for the use of elements 301-303, 501-503, 401(1-3), 402(1-3), 403(1-3), 601(1-2), 602(1-2), and 603(1-2) in which adjacent legs are located in close proximity to one another so that there is a de minimus air gap 175 (FIG. 5) of length G1 between the adjacent legs as described above with reference to FIGS. 4 and 5. Specifically, a gap 175 is provided between a leg of the ferrite element isolator 302 of the first switch-triad-assembly 201 and a leg of the ferrite element isolator 402-1 of the inverted-switch-triad-assembly 220-1. Likewise, a gap 175 is provided between a leg of the ferrite element isolator 602-1 of the sandwiched switch-triad-assembly 240-1 and the adjacent leg of the ferrite element isolator 403-1 of the inverted-switch-triad-assembly 220-1 and a gap 175 is provided between a leg of the ferrite element isolator 603-1 of the sandwiched switch-triad-assembly 240-1 and the adjacent leg of the ferrite element isolator 402-2 of the inverted-switch-triad-assembly 220-2. Additionally, a gap 175 is provided between a leg of the ferrite element isolator 502 of the second switch-triad-assembly 202 and a leg of the two ferrite element isolator 403-3. In this manner, the schematic implementation of the 5-for-4 redundant switch 106-2 has a smaller assembly size than the conventional 5-for-4 redundant switches.

Figure 8:
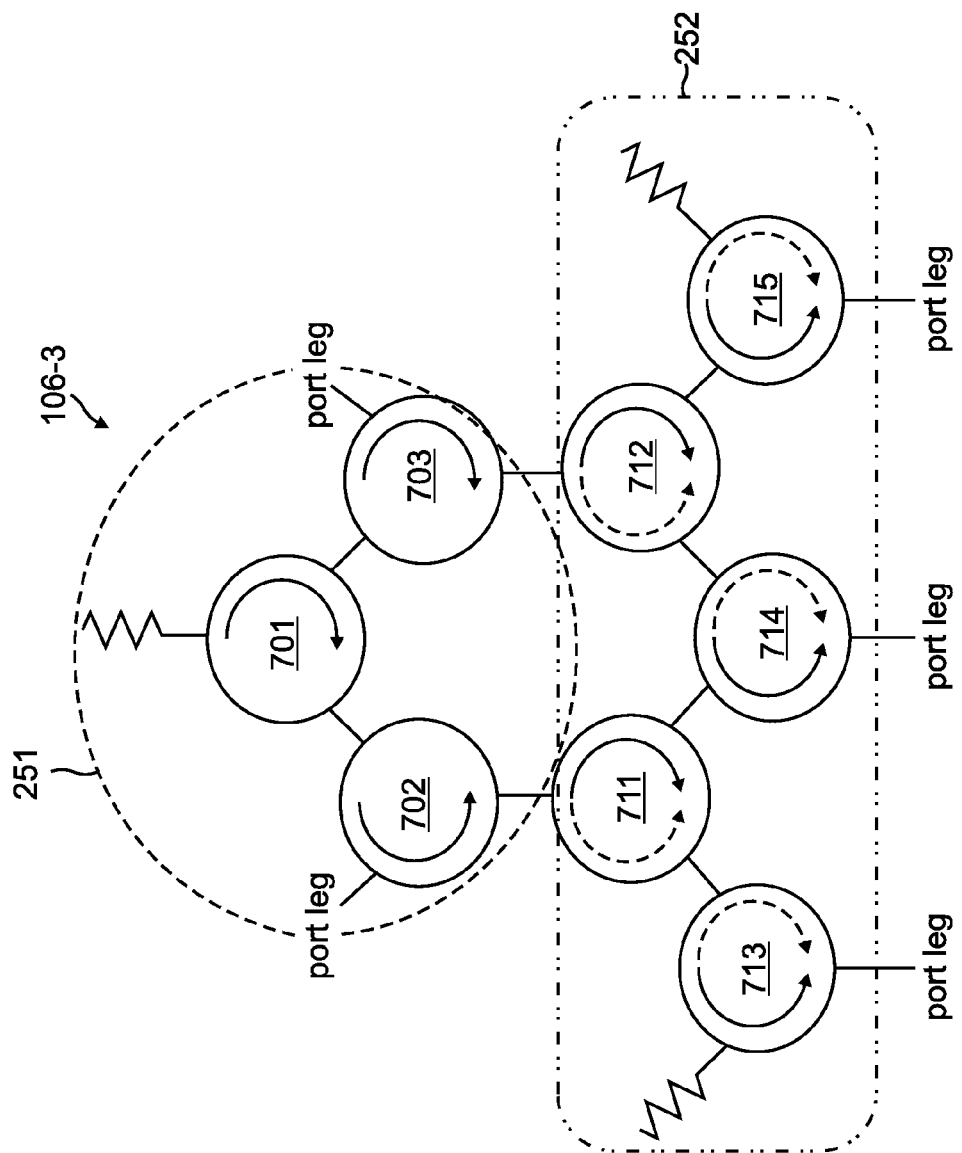
FIG. 8 is a schematic illustration of an embodiment of a 3-for-2 redundant switch configuration in accordance with the present application.
Figure 9:
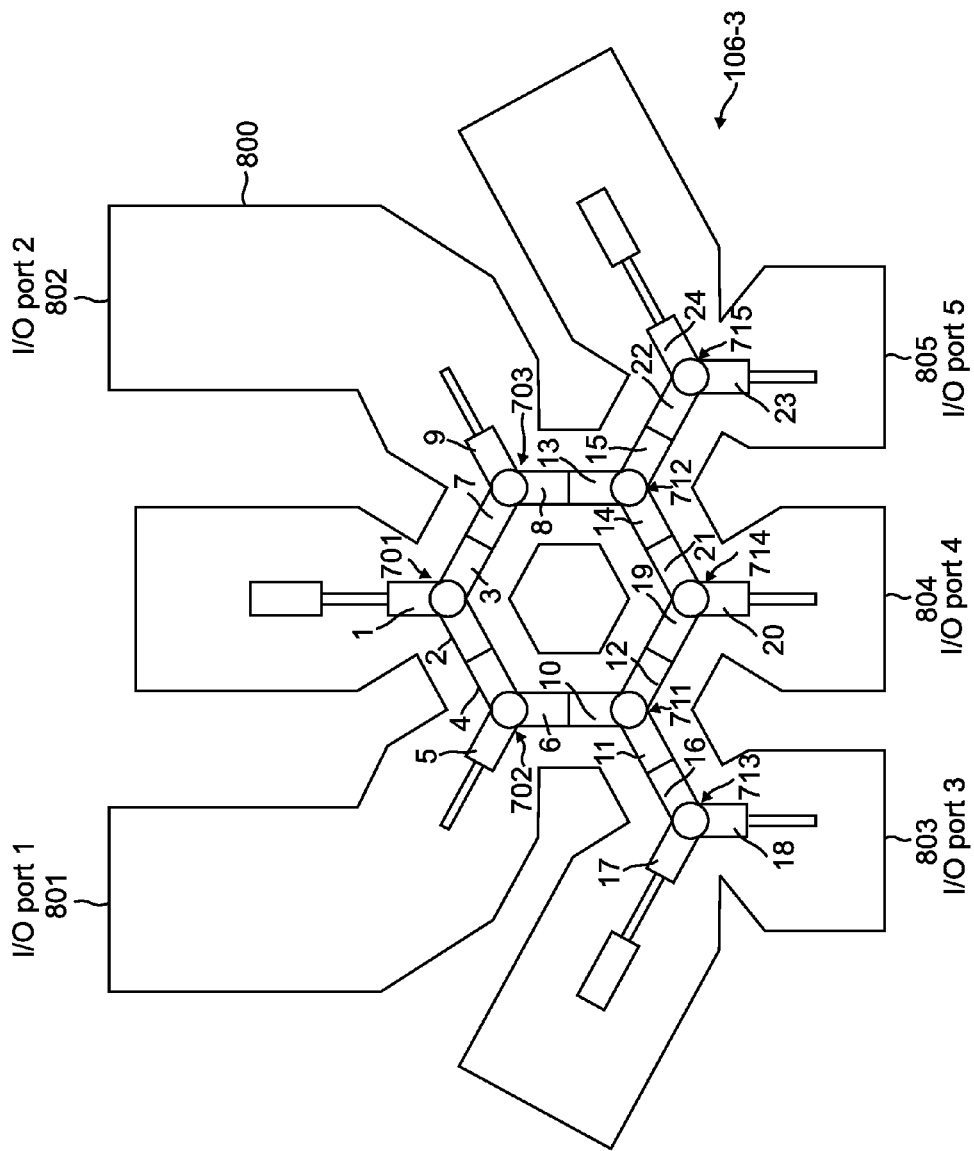
FIG. 9 is a top view of a switch system including the 3-for-2 redundant switch configured as shown in FIG. 8 and positioned in a waveguide structure in accordance with the present application.

FIG. 8 is a schematic illustration of an embodiment of a 3-for-2 redundant switch configuration in accordance with the present application. FIG. 9 is a top view of a switch system including a 3-for-2 redundant switch 106-3 configured as shown in FIG. 8 and positioned in a waveguide structure 800 in accordance with the present application. The 3-for-2 redundant switch 106-3 includes a triad-assembly 251 that is coupled to a switch-penta-assembly 252.

The triad-assembly 251 includes a first non-switching ferrite element isolator 701, a second non-switching ferrite element isolator 702, and a third non-switching ferrite element isolator 703. The first non-switching ferrite element isolator 701 has a loaded leg 1. The second non-switching ferrite element isolator 702 has a first port leg 5 in the I/O port 801 of the waveguide structure 800. The third non-switching ferrite element isolator 703 has a second port leg 9 in the I/O port 802 of the waveguide structure 800.

The switch-penta-assembly 252 includes five switching ferrite elements: a first switching ferrite element 711; a second switching ferrite element 712; a third switching ferrite element 713; a fourth switching ferrite element 714; and a fifth switching ferrite element 715. Within the switch-penta-assembly 252, the first and second ferrite elements 711 and 712 are coupled to a respective one of the second and third non-switching ferrite element isolators 702 and 703. The leg 10 of first switching ferrite element 711 in switch-penta-assembly 252 is coupled to the leg 6 of second non-switching ferrite element isolator 702 in the triad-assembly 251. The leg 13 of second switching ferrite element 712 in switch-penta-assembly 252 is coupled to the leg 8 of the third non-switching ferrite element isolator 703 in the triad-assembly 251.

The other three switching ferrite elements 713-715 of the five switching ferrite element circulators 711-715 have port legs 18, 20, and 23, respectively.

In order to reduce the size of the 3-for-2 redundant switch 106-3, a gap 175 is provided between adjacent legs of the first and second non-switching ferrite element isolators 701 and 702; a gap 175 is provided between adjacent legs of the first and third non-switching ferrite element isolators 701 and 703; a gap 175 is provided between adjacent legs of the first switching ferrite element 711 and the third switching ferrite element 713; a gap 175 is provided between adjacent legs of the first switching ferrite element 711 and the fourth switching ferrite element 714; a gap 175 is provided between adjacent legs of the second switching ferrite element 712 and the fourth switching ferrite element 713; a gap 175 is provided between adjacent legs of the second switching ferrite element 712 and the fifth switching ferrite element 715; a de minimus gap is provided between adjacent legs of the second non-switching element isolator 702 and the first switching element circulator 711; and a de minimus gap is provided between adjacent legs of the third non-switching element isolator 703 and the second switching element circulator 712.

The function and structure of the ferrite elements in the triad-assembly 251 and the switch-penta-assembly 252 are similar to the function and structure of the elements described above with reference to FIGS. 3, 4, and 5 as is understandable to one skilled in the art upon reading and understanding this application.

Figure 10:
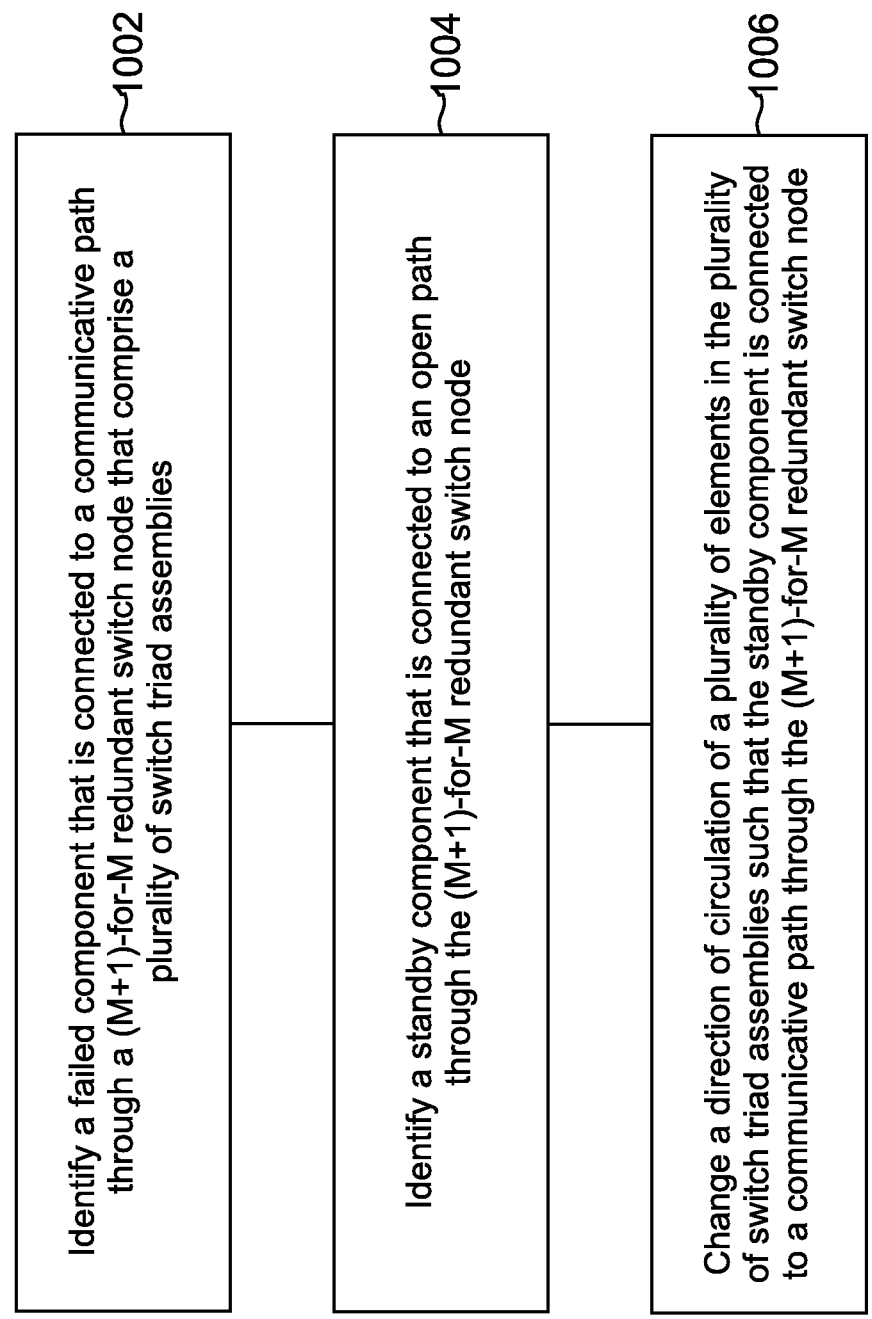
FIG. 10 is a flow diagram of a method for routing signals through a circulator redundancy network in one embodiment described in the present disclosure.

FIG. 10 is a flow diagram of a method 1000 for switching communication paths through an (M+1)-for-M redundant switch node 100 (FIG. 1) in a communication network. Method 1000 proceeds at 1002, where a failed component 108 (FIG. 1) is identified, where the failed component 108 is connected to a communicative path through an (M+1)-for-M redundant switch 106-i (i=A and B in FIG. 1 and i=1, 2, and 3 in FIGS. 3, 6, and 8, respectively) that includes a plurality of switch-triad-assemblies 201, 202, 220, and/or 240. For example, an (M+1)-for-M redundant switch node 100 may have multiple LNAs 108, where some of the LNAs are standby LNAs in the event an operation LNA fails. Further, the operational LNA may connect to other components 108 on the switch node 100. During the operation of the (M+1)-for-M redundant switch node 100, the (M+1)-for-M redundant switch node 100 may monitor the operational LNAs 108 to determine when a failure occurs.

In certain implementation, when a failed component 108 is identified, method 1000 proceeds at 1004, where a standby component 108 is identified, where the standby component is connected to an open path through the (M+1)-for-M redundant switches 106A and 106B in the (M+1)-for-M redundant switch node 100. Method 1000 then proceeds at 1006 where a direction of circulation of a plurality of elements in the plurality of switch-triad-assemblies is changed such that the standby component 108 is connected to a communicative path through the (M+1)-for-M redundant switches 106A and 106B.

EXAMPLE EMBODIMENTS

Example 1 includes an (M+1)-for-M redundant switch, where M is an integer greater than 1, the (M+1)-for-M redundant switch comprising: a first switch-triad-assembly including a first switching element circulator and two element isolators; a second switch-triad-assembly including a second switching element circulator and two element isolators and; and at least one inverted-switch-triad-assembly including a third switching element circulator and two element isolators, wherein one of the element isolators of the first switch-triad-assembly is arranged to couple power with one of the two element isolators of one of the at least one inverted-switch-triad-assembly, and wherein one of the element isolators of the second switch-triad-assembly is arranged to couple power with another one of the two element isolators of one of the at least one inverted-switch-triad-assembly.

Example 2 includes the (M+1)-for-M redundant switch, of Example 1, wherein the at least one inverted-switch-triad-assembly is a positive integral number K of inverted-switch-triad-assemblies, where K is two or more, the (M+1)-for-M redundant switch further comprising: (K−1) sandwiched switch-triad-assemblies including a fourth switching element circulator and two element isolators, the plurality of (K−1) sandwiched switch-triad-assemblies alternately interposed between the K inverted-switch-triad-assemblies, wherein the element isolators of the (K−1) sandwiched switch-triad-assemblies are arranged to couple power with the element isolators of the K inverted-switch-triad-assemblies.

Example 3 includes the (M+1)-for-M redundant switch of Example 2, wherein de minimus gaps are provided between legs of the element isolators of the (K−1) sandwiched switch-triad-assemblies adjacent to the respective legs of the element isolators and of the K inverted-switch-triad-assemblies.

Example 4 includes the (M+1)-for-M redundant switch of any of Examples 1-3, wherein a de minimus gap is provided between a leg of one of the two element isolators of the first switch-triad-assembly and a leg of one of the two element isolators of one of the K inverted-switch-triad-assemblies.

Example 5 includes the (M+1)-for-M redundant switch of any of Examples 1-4, wherein a de minimus gap is provided between a leg of one of the two element isolators of the second switch-triad-assembly and a leg of one of the two element isolators of one of the K inverted-switch-triad-assemblies.

Example 6 includes the (M+1)-for-M redundant switch of any of Examples 1-5, wherein for at least one of: the first switch-triad-assembly; the second switch-triad-assembly; and the at least one inverted-switch-triad-assembly, a de minimus gap is provided between a leg of the two element isolators and a leg of the switching element circulator.

Example 7 includes the (M+1)-for-M redundant switch of any of Examples 1-6, wherein at least one leg of at least one of the two element isolators of the first switch-triad-assembly, the second switch-triad-assembly, and the at least one inverted-switch-triad-assembly is at least one loaded leg, and wherein at least one leg of the switching element circulator of the first switch-triad-assembly, the second switch-triad-assembly, and the at least one inverted-switch-triad-assembly is a port leg.

Example 8 includes the (M+1)-for-M redundant switch of any of Examples 1-7, wherein a continuous junction having no gap is provided between a leg of one of the two element isolators of the first switch-triad-assembly and a leg of one of the two element isolators of the K inverted-switch-triad-assemblies, and wherein a continuous junction having no gap is provided between a leg of one of the two element isolators of the second switch-triad-assembly and a leg of one of the two element isolators.

Example 9 includes the (M+1)-for-M redundant switch of any of Examples 1-8, wherein the element isolators are switching element circulators controlled to circulate electromagnetic fields in one direction.

Example 10 includes the (M+1)-for-M redundant switch of any of Examples 1-9, wherein the element isolators are switching element circulators controlled to circulate electromagnetic fields in one direction until a failure requires at least one switching element circulator to circulate electromagnetic fields in an opposite direction.

Example 11 includes an (M+1)-for-M redundant switch node, where M is an integer greater than 1, the system comprising: at least two (M+1)-for-M redundant switches, the at least two (M+1)-for-M redundant switches including: a first switch-triad-assembly including a first switching element circulator and two element isolators, wherein the first switching element circulator includes a port leg in a first input/output port, and wherein one of the two element isolators includes a port leg in a third input/output port; a second switch-triad-assembly including a second switching element circulator and two element isolators, wherein the second switching element circulator includes a second port leg in a second input/output port, and wherein one of the two element isolators includes a port leg in a fifth input/output port; and at least one inverted-switch-triad-assembly including a third switching element circulator and two element isolators, wherein the at least one third switching element circulator includes a respective port leg in a respective at least one third input/output port, wherein one of the element isolators of the first switch-triad-assembly is coupled to one of the two element isolators of one of the at least one inverted-switch-triad-assembly, and wherein the one of the element isolators of the second switch-triad-assembly is arranged to couple power with another one of the two element isolators of one of the at least one inverted-switch-triad-assembly; and (M+1) components for a respective pair of (M+1)-for-M redundant switches, wherein first input/output ports of the (M+1) components are coupled to a first one of the respective pair of (M+1)-for-M redundant switches and second input/output ports of the (M+1) components are coupled to a second one of the respective pair of (M+1)-for-M redundant switches, wherein the first switch-triad-assembly, the second switch-triad-assembly, and the at least one inverted-switch-triad-assembly are able to route a path through the (M+1)-for-M redundant switch node when a component in the (M+1) components associated with a respective pair of (M+1)-for-M redundant switches has failed.

Example 12 includes the (M+1)-for-M redundant switch node, of Example 11, further comprising: a waveguide structure in which the first switch-triad-assembly, the second switch-triad-assembly and the at least one inverted-switch-triad-assembly are positioned.

Example 13 includes the (M+1)-for-M redundant switch node, of any of Examples 11-12, wherein the at least one inverted-switch-triad-assembly is a positive integral number K of inverted-switch-triad-assemblies, where K is two or more, the (M+1)-for-M redundant switch further comprising: a plurality of (K−1) sandwiched switch-triad-assemblies, wherein a (K−1) sandwiched switch-triad-assembly includes a fourth switching element circulator and two element isolators, and wherein the plurality of (K−1) sandwiched switch-triad-assemblies are alternately interposed between the K inverted-switch-triad-assemblies, wherein the element isolators of the plurality of (K−1) sandwiched switch-triad-assemblies are arranged to couple power with the element isolators of the K inverted-switch-triad-assemblies, wherein the plurality of fourth switching element circulators in the respective plurality of (K−1) sandwiched switch-triad-assemblies include a respective plurality of port legs in a respective plurality of additional input/output ports, and wherein two element isolators in the respective plurality of (K−1) sandwiched switch-triad-assemblies are loaded.

Example 14 includes the (M+1)-for-M redundant switch node of Example 13, wherein de minimus gaps are provided between legs of the element isolators of the (K−1) sandwiched switch-triad-assemblies adjacent to the respective legs of the element isolators of the K inverted-switch-triad-assemblies.

Example 15 includes the (M+1)-for-M redundant switch node of any of Examples 11-14, wherein a de minimus gap is provided between a leg of one of the two element isolators of the first switch-triad-assembly and a leg of one of the two element isolators of one of the K inverted-switch-triad-assemblies, wherein a de minimus gap is provided between a leg of one of the two element isolators of the second switch-triad-assembly and a leg of one of the two element isolators of one of the K inverted-switch-triad-assemblies, and wherein for at least one of: the first switch-triad-assembly; the second switch-triad-assembly; and the at least one inverted-switch-triad-assembly, a de minimus gap is provided between a leg of the two element isolators and a leg of the switching element circulator.

Example 16 includes the (M+1)-for-M redundant switch node of any of Examples 11-15, wherein at least one leg of at least one of the two element isolators of the first switch-triad-assembly, the second switch-triad-assembly, and the at least one inverted-switch-triad-assembly is at least one loaded leg.

Example 17 includes the (M+1)-for-M redundant switch node of any of Examples 11-16, wherein a continuous junction having no gap is provided between a leg of one of the two element isolators of the first switch-triad-assembly and a leg of one of the two element isolators; wherein a continuous junction having no gap is provided between a leg of one of the two element isolators of the second switch-triad-assembly and a leg of one of the two element isolators; and wherein for at least one of: the first switch-triad-assembly; the second switch-triad-assembly; and the at least one inverted-switch-triad-assembly, a continuous junction having no gap is provided between a leg of the two element isolators and a leg of the switching element circulator.

Example 18 includes the (M+1)-for-M redundant switch node of any of Examples 11-17, wherein the element isolators are switching element circulators controlled to circulate electromagnetic fields in one direction until a failure requires at least one switching element circulator to circulate electromagnetic fields in an opposite direction.

Example 19 includes a 3-for-2 redundant switch, comprising: a triad-assembly including a first non-switching element isolator, a second non-switching element isolator, and a third non-switching element isolator, wherein the first non-switching element isolator has a loaded leg, the second non-switching element isolator has a first port leg, and the third non-switching element isolator has a second port leg; and a switch-penta-assembly including a first switching element circulator, a second switching element circulator, a third switching element circulator, a fourth switching element circulator, and a fifth switching element circulator; and wherein the first and second switching element circulators are coupled to a respective one of the second and third non-switching element isolators, and the other three of the five switching element circulators have port legs.

Example 20 includes the 3-for-2 redundant switch of Example 19, wherein a de minimus gap is provided between adjacent legs of the first and second non-switching element isolators, wherein a de minimus gap is provided between adjacent legs of the first and third non-switching element isolators, wherein a de minimus gap is provided between adjacent legs of the first switching element circulator and the third switching element circulator, wherein a de minimus gap is provided between adjacent legs of the first switching element circulator and the fourth switching element circulator, wherein a de minimus gap is provided between adjacent legs of the second switching element circulator and the fourth switching element circulator, wherein a de minimus gap is provided between adjacent legs of the second switching element circulator and the fifth switching element circulator, wherein a de minimus gap is provided between adjacent legs of the second switching element circulator and the fifth switching element circulator, wherein a de minimus gap is provided between adjacent legs of the second non-switching element isolator and the first switching element circulator, and wherein a de minimus gap is provided between adjacent legs of the third non-switching element isolator and the second switching element circulator.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. An (M+1)-for-M redundant switch, where M is an integer greater than 1, the (M+1)-for-M redundant switch comprising:
    a first switch-triad-assembly including a first switching element circulator and two element isolators;
    a second switch-triad-assembly including a second switching element circulator and two element isolators; and
    at least one inverted-switch-triad-assembly including a third switching element circulator and two element isolators,
    wherein one of the element isolators of the first switch-triad-assembly is arranged to couple power with one of the two element isolators of one of the at least one inverted-switch-triad-assembly, and
    wherein one of the element isolators of the second switch-triad-assembly is arranged to couple power with another one of the two element isolators of one of the at least one inverted-switch-triad-assembly.

2. The (M+1)-for-M redundant switch, of claim 1, wherein the at least one inverted-switch-triad-assembly is a positive integral number K of inverted-switch-triad-assemblies, where K is two or more, the (M+1)-for-M redundant switch further comprising:
    (K−1) sandwiched switch-triad-assemblies including a fourth switching element circulator and two element isolators, the plurality of (K−1) sandwiched switch-triad-assemblies alternately interposed between the K inverted-switch-triad-assemblies,
    wherein the element isolators of the (K−1) sandwiched switch-triad-assemblies are arranged to couple power with the element isolators of the K inverted-switch-triad-assemblies.

3. The (M+1)-for-M redundant switch of claim 2, wherein de minimus gaps are provided between legs of the element isolators of the (K−1) sandwiched switch-triad-assemblies adjacent to the respective legs of the element isolators and of the K inverted-switch-triad-assemblies.

4. The (M+1)-for-M redundant switch of claim 1, wherein a de minimus gap is provided between a leg of one of the two element isolators of the first switch-triad-assembly and a leg of one of the two element isolators of one of the K inverted-switch-triad-assemblies.

5. The (M+1)-for-M redundant switch of claim 1, wherein a de minimus gap is provided between a leg of one of the two element isolators of the second switch-triad-assembly and a leg of one of the two element isolators of one of the K inverted-switch-triad-assemblies.

6. The (M+1)-for-M redundant switch of claim 1, wherein for at least one of: the first switch-triad-assembly; the second switch-triad-assembly; and the at least one inverted-switch-triad-assembly, a de minimus gap is provided between a leg of the two element isolators and a leg of the switching element circulator.

7. The (M+1)-for-M redundant switch of claim 1, wherein at least one leg of at least one of the two element isolators of the first switch-triad-assembly, the second switch-triad-assembly, and the at least one inverted-switch-triad-assembly is at least one loaded leg, and
    wherein at least one leg of the switching element circulator of the first switch-triad-assembly, the second switch-triad-assembly, and the at least one inverted-switch-triad-assembly is a port leg.

8. The (M+1)-for-M redundant switch of claim 1, wherein a continuous junction having no gap is provided between a leg of one of the two element isolators of the first switch-triad-assembly and a leg of one of the two element isolators of the K inverted-switch-triad-assemblies, and wherein a continuous junction having no gap is provided between a leg of one of the two element isolators of the second switch-triad-assembly and a leg of one of the two element isolators.

9. The (M+1)-for-M redundant switch of claim 1, wherein the element isolators are switching element circulators controlled to circulate electromagnetic fields in one direction.

10. The (M+1)-for-M redundant switch of claim 1, wherein the element isolators are switching element circulators controlled to circulate electromagnetic fields in one direction until a failure requires at least one switching element circulator to circulate electromagnetic fields in an opposite direction.

11. An (M+1)-for-M redundant switch node, where M is an integer greater than 1, the system comprising:
   at least two (M+1)-for-M redundant switches, the at least two (M+1)-for-M redundant switches including:
      a first switch-triad-assembly including a first switching element circulator and two element isolators, wherein the first switching element circulator includes a port leg in a first input/output port, and wherein one of the two element isolators includes a port leg in a third input/output port;
      a second switch-triad-assembly including a second switching element circulator and two element isolators, wherein the second switching element circulator includes a second port leg in a second input/output port, and wherein one of the two element isolators includes a port leg in a fifth input/output port; and
      at least one inverted-switch-triad-assembly including a third switching element circulator and two element isolators, wherein the at least one third switching element circulator includes a respective port leg in a respective at least one third input/output port,
   wherein one of the element isolators of the first switch-triad-assembly is coupled to one of the two element isolators of one of the at least one inverted-switch-triad-assembly, and
   wherein the one of the element isolators of the second switch-triad-assembly is arranged to couple power with another one of the two element isolators of one of the at least one inverted-switch-triad-assembly; and
   (M+1) components for a respective pair of (M+1)-for-M redundant switches, wherein first input/output ports of the (M+1) components are coupled to a first one of the respective pair of (M+1)-for-M redundant switches and second input/output ports of the (M+1) components are coupled to a second one of the respective pair of (M+1)-for-M redundant switches, wherein the first switch-triad-assembly, the second switch-triad-assembly, and the at least one inverted-switch-triad-assembly are able to route a path through the (M+1)-for-M redundant switch node when a component in the (M+1) components associated with a respective pair of (M+1)-for-M redundant switches has failed.

12. The (M+1)-for-M redundant switch node, of claim 11, further comprising:
   a waveguide structure in which the first switch-triad-assembly, the second switch-triad-assembly and the at least one inverted-switch-triad-assembly are positioned.

13. The (M+1)-for-M redundant switch node, of claim 11, wherein the at least one inverted-switch-triad-assembly is a positive integral number K of inverted-switch-triad-assemblies, where K is two or more, the (M+1)-for-M redundant switch further comprising:
   a plurality of (K−1) sandwiched switch-triad-assemblies, wherein a (K−1) sandwiched switch-triad-assembly includes a fourth switching element circulator and two element isolators, and wherein the plurality of (K−1) sandwiched switch-triad-assemblies are alternately interposed between the K inverted-switch-triad-assemblies,
   wherein the element isolators of the plurality of (K−1) sandwiched switch-triad-assemblies are arranged to couple power with the element isolators of the K inverted-switch-triad-assemblies,
   wherein the plurality of fourth switching element circulators in the respective plurality of (K−1) sandwiched switch-triad-assemblies include a respective plurality of port legs in a respective plurality of additional input/output ports, and wherein two element isolators in the respective plurality of (K−1) sandwiched switch-triad-assemblies are loaded.

14. The (M+1)-for-M redundant switch node of claim 13, wherein de minimus gaps are provided between legs of the element isolators of the (K−1) sandwiched switch-triad-assemblies adjacent to the respective legs of the element isolators of the K inverted-switch-triad-assemblies.

15. The (M+1)-for-M redundant switch node of claim 11, wherein a de minimus gap is provided between a leg of one of the two element isolators of the first switch-triad-assembly and a leg of one of the two element isolators of one of the K inverted-switch-triad-assemblies,
   wherein a de minimus gap is provided between a leg of one of the two element isolators of the second switch-triad-assembly and a leg of one of the two element isolators of one of the K inverted-switch-triad-assemblies, and
   wherein for at least one of: the first switch-triad-assembly; the second switch-triad-assembly; and the at least one inverted-switch-triad-assembly, a de minimus gap is provided between a leg of the two element isolators and a leg of the switching element circulator.

16. The (M+1)-for-M redundant switch node of claim 11, wherein at least one leg of at least one of the two element isolators of the first switch-triad-assembly, the second switch-triad-assembly, and the at least one inverted-switch-triad-assembly is at least one loaded leg.

17. The (M+1)-for-M redundant switch node of claim 11, wherein a continuous junction having no gap is provided between a leg of one of the two element isolators of the first switch-triad-assembly and a leg of one of the two element isolators;
   wherein a continuous junction having no gap is provided between a leg of one of the two element isolators of the second switch-triad-assembly and a leg of one of the two element isolators; and
   wherein for at least one of: the first switch-triad-assembly; the second switch-triad-assembly; and the at least one inverted-switch-triad-assembly, a continuous junction having no gap is provided between a leg of the two element isolators and a leg of the switching element circulator.

18. The (M+1)-for-M redundant switch node of claim 11, wherein the element isolators are switching element circulators controlled to circulate electromagnetic fields in one direction until a failure requires at least one switching element circulator to circulate electromagnetic fields in an opposite direction.

19. A 3-for-2 redundant switch, comprising:
   a triad-assembly including a first non-switching element isolator, a second non-switching element isolator, and a third non-switching element isolator, wherein the first non-switching element isolator has a loaded leg, the second non-switching element isolator has a first port leg, and the third non-switching element isolator has a second port leg; and
   a switch-penta-assembly including a first switching element circulator, a second switching element circulator, a third switching element circulator, a fourth switching element circulator, and a fifth switching element circulator; and wherein the first and second switching element circulators are coupled to a respective one of the second and third non-switching element isolators, and the other three of the five switching element circulators have port legs.

20. The 3-for-2 redundant switch of claim 19, wherein a de minimus gap is provided between adjacent legs of the first and second non-switching element isolators, wherein a de minimus gap is provided between adjacent legs of the first and third non-switching element isolators, wherein a de minimus gap is provided between adjacent legs of the first switching element circulator and the third switching element circulator, wherein a de minimus gap is provided between adjacent legs of the first switching element circulator and the fourth switching element circulator, wherein a de minimus gap is provided between adjacent legs of the second switching element circulator and the fourth switching element circulator, wherein a de minimus gap is provided between adjacent legs of the second switching element circulator and the fifth switching element circulator, wherein a de minimus gap is provided between adjacent legs of the second non-switching element isolator and the first switching element circulator, and wherein a de minimus gap is provided between adjacent legs of the third non-switching element isolator and the second switching element circulator.

\* \* \* \* \*